(12) United States Patent
Sattler et al.

(10) Patent No.: US 8,231,725 B2
(45) Date of Patent: Jul. 31, 2012

(54) SEMICONDUCTOR WAFERS OF SILICON AND METHOD FOR THEIR PRODUCTION

(75) Inventors: Andreas Sattler, Trostberg (DE); Wilfried von Ammon, Hochburg/Ach (AT); Martin Weber, Kastl (DE); Walter Haeckl, Zeilarn (DE); Herbert Schmidt, Halsbach (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/225,822

(22) Filed: Sep. 6, 2011

(65) Prior Publication Data

US 2011/0316128 A1   Dec. 29, 2011

Related U.S. Application Data

(62) Division of application No. 12/011,713, filed on Jan. 29, 2008, now Pat. No. 8,043,427.

(60) Provisional application No. 60/887,847, filed on Feb. 2, 2007.

(30) Foreign Application Priority Data

Feb. 2, 2007 (DE) .......................... 10 2007 005 346

(51) Int. Cl.
*C30B 29/06* (2006.01)
(52) U.S. Cl. ................ 117/21; 117/13; 117/15; 117/18; 117/20; 117/932; 423/345
(58) Field of Classification Search .................... 117/13, 117/15, 18, 20, 21, 932; 423/345
See application file for complete search history.

(56) References Cited

U.S. PATENT DOCUMENTS

| 5,954,873 | A  | 9/1999  | Hourai et al. |
| 6,458,202 | B1 | 10/2002 | Kojima et al. |
| 6,858,076 | B1 | 2/2005  | Nakajima et al. |
| 6,869,478 | B2 | 3/2005  | Nakamura et al. |
| 6,902,618 | B2 | 6/2005  | Iida |
| 7,141,113 | B1 | 11/2006 | Nakamura et al. |

(Continued)

FOREIGN PATENT DOCUMENTS

DE   103 39 792 A1   10/2004

(Continued)

OTHER PUBLICATIONS

K. Tanahashi, N. Inoue, Journal of Material Science: Materials in Electronics 10 (1999), pp. 359-363.

(Continued)

*Primary Examiner* — Bob M Kunemund
(74) *Attorney, Agent, or Firm* — Brooks Kushman P.C.

(57) ABSTRACT

Semiconductor wafers of silicon are produced by pulling a single crystal growing on a phase boundary from a melt contained in a crucible and cutting of semiconductor wafers therefrom, wherein during pulling of the single crystal, heat is delivered to a center of the phase boundary and a radial profile of a ratio V/G from the center to an edge of the phase boundary is controlled, G being the temperature gradient perpendicular to the phase boundary and V being the pull rate. The radial profile of the ratio V/G is controlled so that the effect of thermomechanical stress in the single crystal adjoining the phase boundary, is compensated with respect to creation of intrinsic point defects. The invention also relates to defect-free semiconductor wafers of silicon, which can be produced economically by this method.

6 Claims, 10 Drawing Sheets

U.S. PATENT DOCUMENTS

| | | |
|---|---|---|
| 7,442,251 B2 | 10/2008 | Inami et al. |
| 7,608,145 B2 * | 10/2009 | Cho .............................. 117/15 |
| 7,964,275 B2 * | 6/2011 | Muller et al. ................. 428/332 |
| 2004/0112277 A1 | 6/2004 | Kulkarni |
| 2004/0118334 A1 * | 6/2004 | Weber et al. ................... 117/19 |
| 2006/0254498 A1 * | 11/2006 | Weber et al. ................... 117/13 |
| 2006/0283379 A1 | 12/2006 | Inami et al. |
| 2006/0292890 A1 | 12/2006 | Ammon et al. |

FOREIGN PATENT DOCUMENTS

| | | |
|---|---|---|
| EP | 1158076 | 11/2001 |
| JP | 2000072590 A | 3/2000 |
| JP | 2000044388 | 3/2005 |
| WO | 2006137174 A1 | 12/2006 |

OTHER PUBLICATIONS

Nakai et al., Jap. Journal of Applied Physics, vol. 43, No. 4A, 2004, pp. 1247-1253.

* cited by examiner

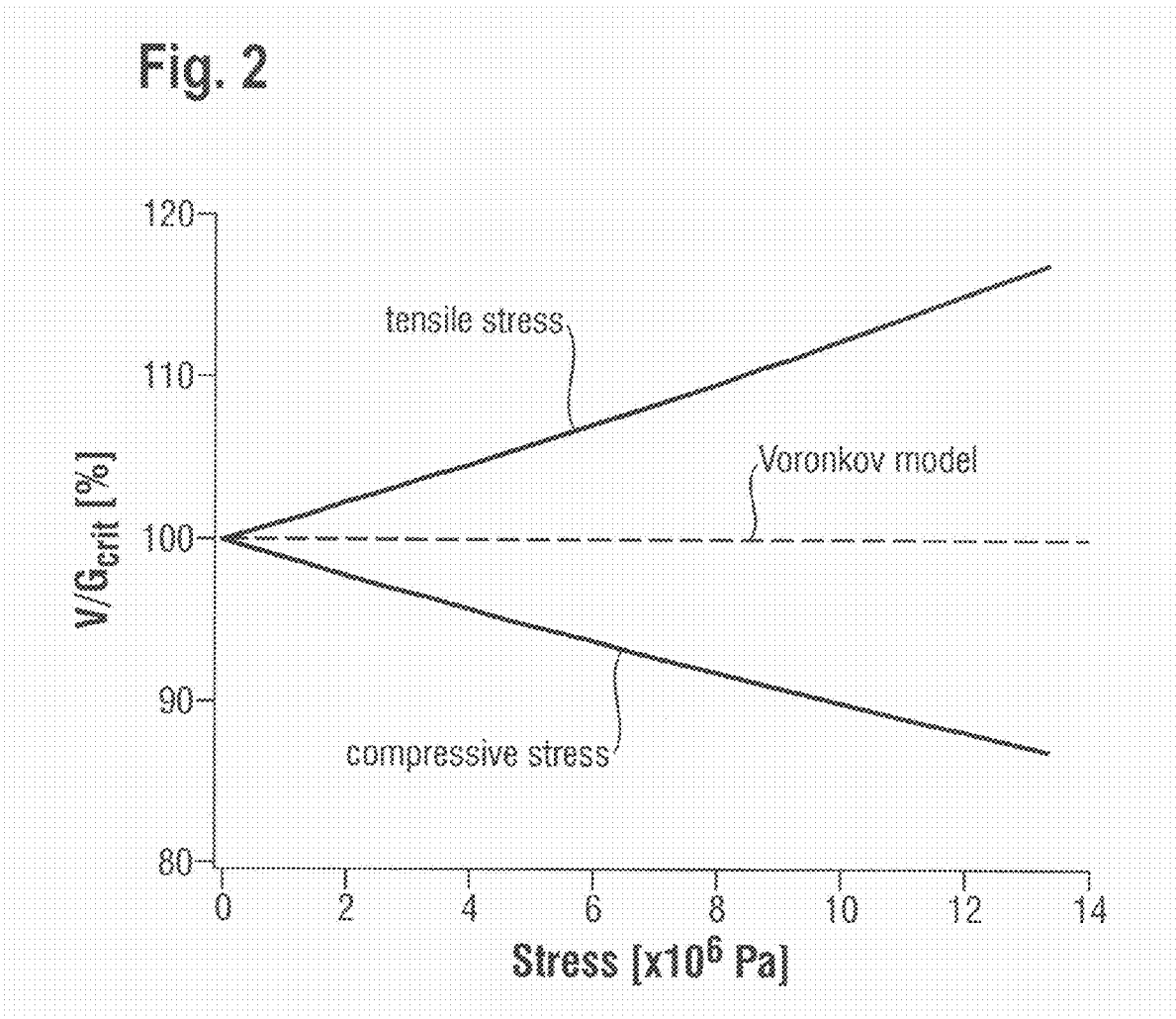

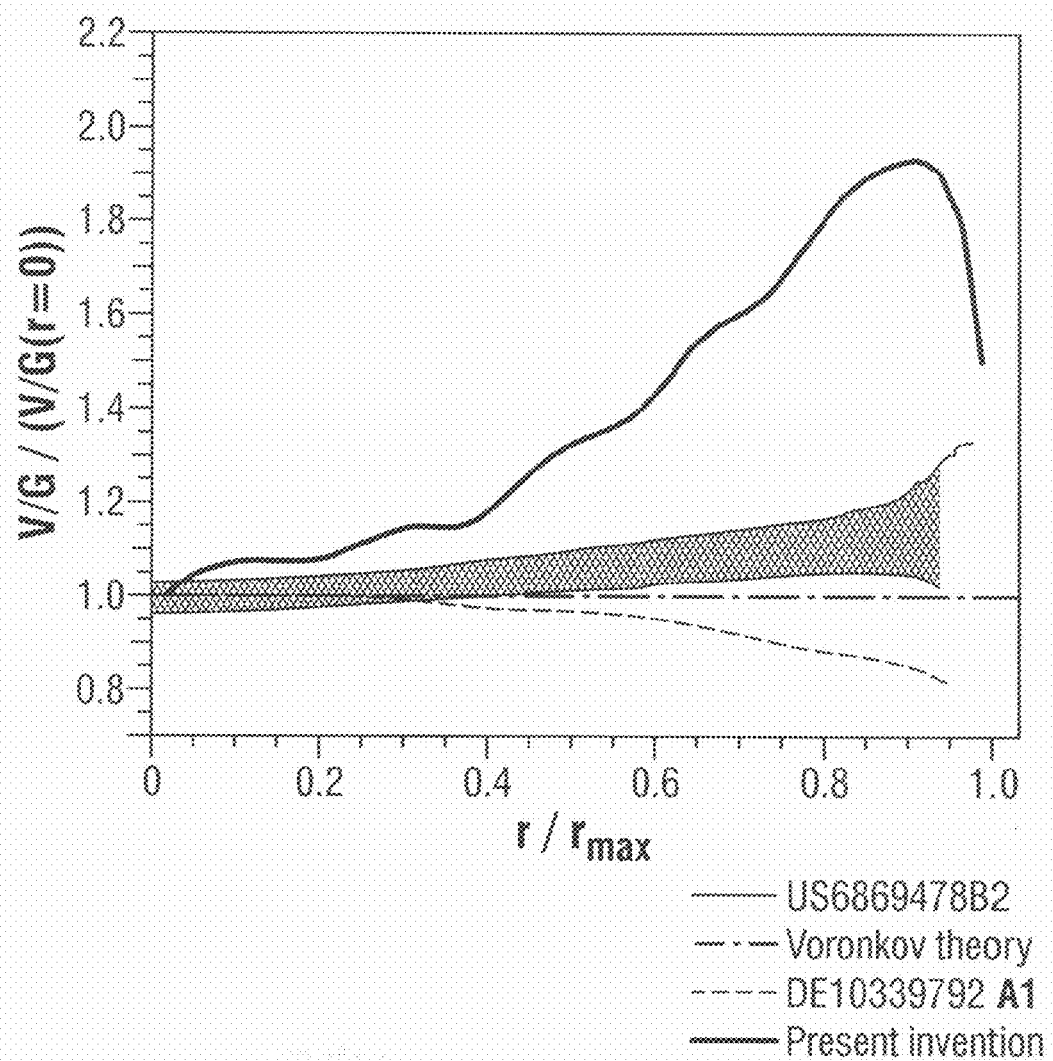

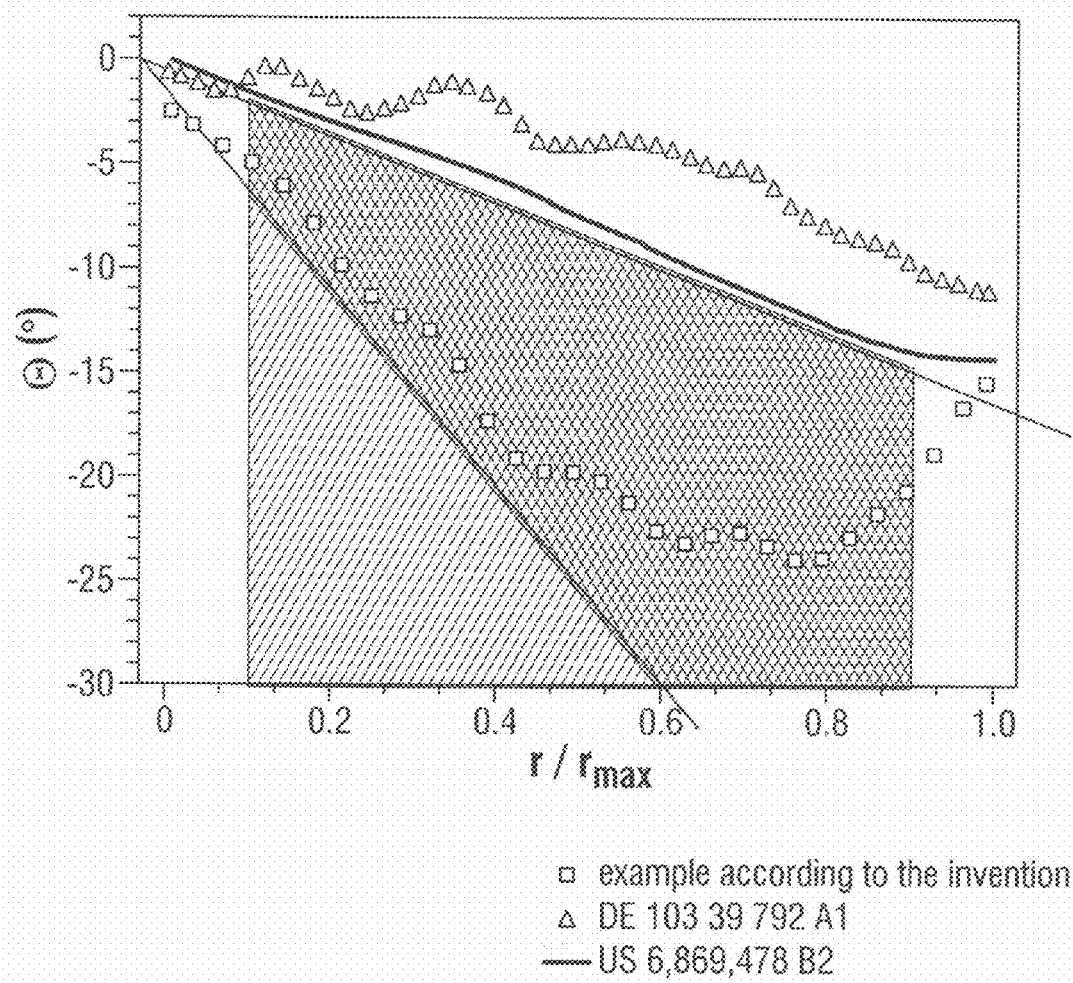

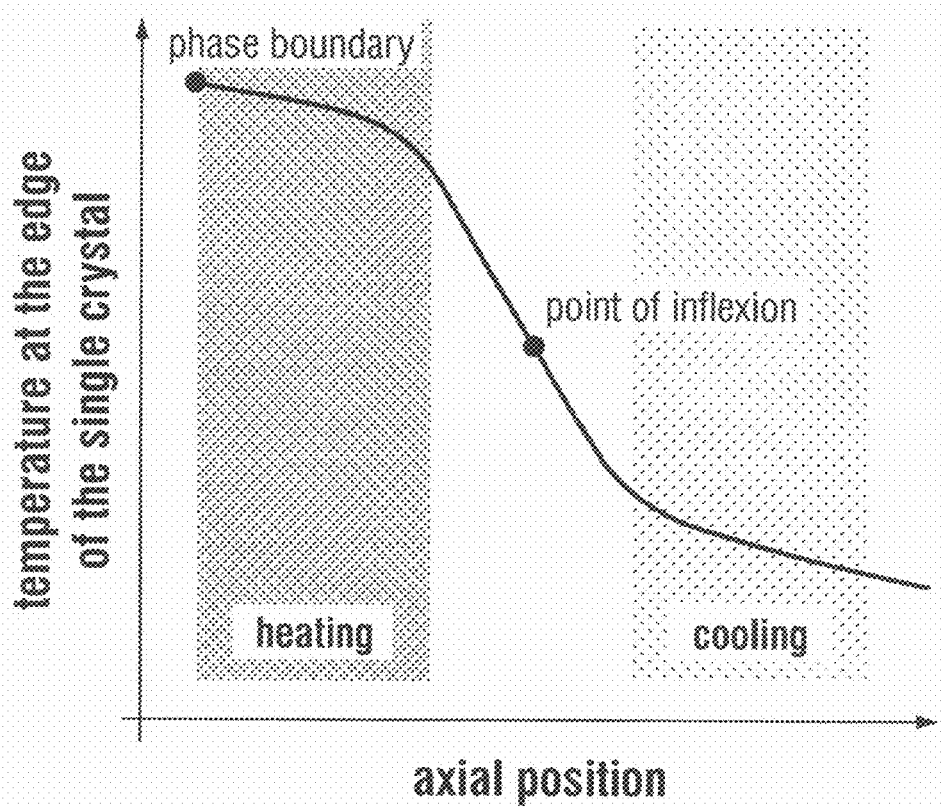

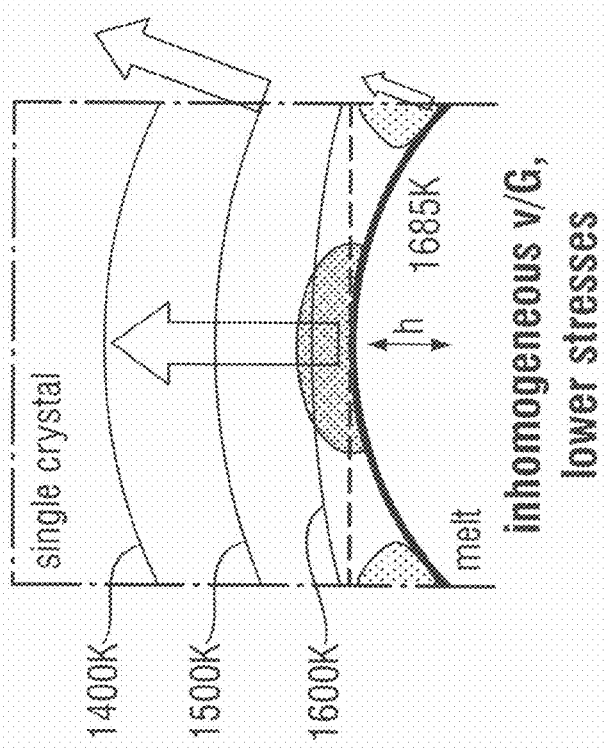
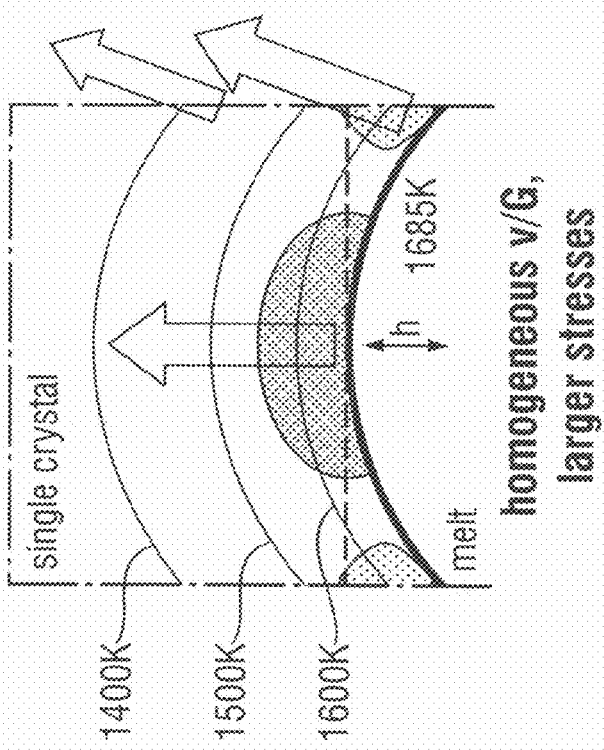

SEMICONDUCTOR WAFERS OF SILICON AND METHOD FOR THEIR PRODUCTION

CROSS-REFERENCE TO RELATED APPLICATION

This application is a division of and claims priority to U.S. application Ser. No. 12/011,713, filed Jan. 29, 2008 now U.S. Pat. No. 8,043,427, which, in turn, claims the benefit of U.S. provisional application Ser. No. 60/887,847, filed Feb. 2, 2007, and claims priority to German application Serial No. 10 2007 005 346.2, filed Feb. 2, 2007, all of which are incorporated herein by reference.

BACKGROUND OF THE INVENTION

1. Field of the Invention

The invention relates to a method for producing semiconductor wafers of silicon, comprising pulling a single crystal growing on a phase boundary from a melt contained in a crucible and cutting semiconductor wafers from the pulled single crystal, wherein heat is delivered to a center of the phase boundary during pulling, and a radial profile of a ratio V/G from the center to an edge of the phase boundary is controlled, with G being the temperature gradient perpendicular to the phase boundary and V being the pull rate at which the single crystal is pulled from the melt. The invention also relates to defect-free semiconductor wafers of silicon, which can be produced by this method. Semiconductor wafers of silicon in the context of the invention are referred to as defect-free so long as neither OSF defects, A-swirl defects, nor COP defects with a size of more than 30 nm are detectable. A method in the context of this invention is regarded as economically viable when, in particular, it is possible to pull single crystals with a diameter of at least 300 mm from a crucible at a rate which is equal to at least 0.5 mm/min and defect-free semiconductor wafers are produced in a high yield, expressed in terms of the total yield of semiconductor wafers.

2. Background Art

DE 103 39 792 A1 describes a method for producing single crystals of silicon which are optimized with respect to their defect properties. Attention is focused on intrinsic point defects and their agglomerates, as well as the Voronkov model which allows predictions regarding the formation of such defects. In the case of intrinsic point defects, distinction is made between interstitial silicon atoms (interstitials) and vacancies. If point defects enter supersaturation when cooling the single crystal, then silicon interstitials will form agglomerates which can be detected in the form of dislocation loops (A-swirl defects, LPITs) and smaller clusters (B-swirl defects). In the event of supersaturation, vacancies form vacancy agglomerates (voids) which, depending on the detection method, are referred to inter alia as COP defects (crystal originated particles, COPs), FPD (flow pattern defects), LLS (localized light scatterers) or DSOD (direct surface oxide defects). It is necessary to ensure that the semiconductor wafers of silicon have no A-swirl defects in the region relevant for producing electronic components, and are as free as possible of COP defects whose size lies in the range of the structure widths of the components, or are of greater size. Semiconductor wafers which fulfill these requirements are often referred to as defect-free or perfect, even though their crystal lattice generally contains smaller COP defects or B-swirl defects, or contains both defect types.

According to the Voronkov model, the intrinsic point defect type which is incorporated in excess into the crystal lattice when pulling the single crystal depends essentially on the ratio of the pull rate V, at which the single crystal is pulled from the melt, and the temperature gradient G perpendicular to the phase boundary between the growing single crystal and the melt. Often, instead of the temperature gradient perpendicular to the phase boundary, the axial temperature gradient directed perpendicularly to the surface of the melt is also used in model calculations. If the ratio V/G falls below a critical ratio, then an excess of silicon interstitials is created. If the critical ratio is exceeded, then vacancies predominate. If there is an excess of vacancies, the size of the COP defects formed depends essentially on two process parameters, namely the aforementioned ratio V/G and the rate at which the single crystal is cooled in the range of from approximately 1100° C. to 1000° C. the nucleation temperature of voids. The COP defects are therefore commensurately smaller as the ratio V/G lies closer to the critical ratio and the more rapidly the single crystal is cooled in this temperature range. In practice, attempts are therefore made to control the two process parameters when pulling the single crystal, so that the defects created by supersaturation of vacancies remain small enough not to interfere with the production of electronic components. Since the structure widths of the components decrease with each generation, the defect size which can still be tolerated decreases accordingly.

Owing to corrosion of the crucible, usually consisting of quartz, oxygen will enter the melt. The oxygen forms small so-called precipitates in the single crystal (as grown bulk micro defects, BMDs). These are desirable to a certain extent because they can bind (getter) metallic impurities to themselves, and thus can be used in order to move such contaminants away from the region of the surface into the interior (bulk) of the semiconductor wafer.

If the single crystal is pulled under conditions in which the ratio V/G lies only slightly above the critical ratio, then the interaction of vacancies and oxygen atoms also leads to the formation of nuclei, which give rise to OSF defects (oxidation induced stacking faults). The presence of a zone with such nuclei (OSF zone) is usually detected by subjecting a semiconductor wafer, cut from the single crystal, to oxidation in wet oxygen at about 1100° C. for a few hours so that OSF defects are formed. Since this defect type is likewise detrimental to the functional integrity of electronic components, endeavors are made to suppress OSF formation, for example by reducing the concentration of oxygen in the melt so that less oxygen is incorporated into the single crystal than would be necessary in order to form OSF defects. The OSF zone can also be avoided by modifying the ratio V/G, for example by using higher or lower pull rates. The formation of OSF nuclei can moreover be reduced by higher cooling rates (in the temperature range of precipitation around 900° C.). It is furthermore known that in order to avoid OSF defects, it is advantageous for the single crystal to contain a small concentration of hydrogen.

Particular difficulties in controlling the ratio V/G result from the fact that the single crystal usually cools faster at the edge than at the center, so that the ratio V/G decreases from the center toward the edge. Despite corresponding control, this can lead to unacceptably large COP defects being formed at the center and/or A-swirl defects in the edge region. The dependency of G on the radial position r, G(r), must therefore be taken into account, especially when defect-free semiconductor wafers of silicon with sizeable diameters are to be produced economically.

In the aforementioned DE 103 39 792 A1, it is proposed to induce a transport of heat directed from below toward the center of the phase boundary. This is intended to achieve two effects. On the one hand, the increase in the temperature gradient G concomitant with the heat transport is intended to make it possible to increase the pull rate V correspondingly, without defects therefore being generated. On the other hand, it is intended to homogenize i.e. equalize the radial profile of the ratio V/G, so that it varies as little as possible from the center to the edge of the phase boundary and lies as close as possible to the critical ratio. With this strategy, it is feasible to produce defect-free semiconductor wafers with a diameter of 300 mm, in which case the single crystal can be pulled at a rate of 0.36 mm/min.

U.S. Pat. No. 6,869,478 B2 discloses that a phase boundary curved in the direction of the single crystal generates a temperature gradient which is steepest perpendicular to the phase boundary. Taking into account the Voronkov model, according to which point defects diffuse in the direction of the temperature gradient and according to which silicon interstitials diffuse faster than vacancies, it is furthermore disclosed that the radial diffusion of silicon interstitials due to the curvature of the phase boundary increases the concentration of vacancies at the center of the phase boundary. The ratio V/G, at which the concentrations of vacancies and silicon interstitials correspond to each other, will therefore be commensurately less as the phase boundary is curved more strongly toward the single crystal.

The present inventors found that the predictions for defect distributions, even when they take the radial distribution into account, differ commensurately more strongly from the defect distributions found in experiments as the rate at which the single crystal is pulled is faster, and as the diameter of the single crystal is greater.

FIG. 1 shows an extreme example of this observation. A single crystal of silicon with a nominal diameter of 300 mm was pulled at a high pull rate and an inhomogeneous radial profile of V/G was adjusted. In the central region, V/G was adjusted to be so low that the formation of A-swirl defects could be expected in this region according to the predictions of the Voronkov model. In fact, however, COP defects with a diameter of more than 30 nm were found. In the edge region, the ratio V/G was adjusted to be so high that large COP defects should be formed there. In fact, however, A-swirl defects were found.

These results showed that the strategy hitherto followed in the prior art, of adjusting a ratio V/G whose radial profile changes as little as possible and which corresponds as far as possible to the critical ratio, will not be successful when defect-free semiconductor wafers of silicon are to be produced economically.

SUMMARY OF THE INVENTION

It is therefore an object of the present invention to remedy this situation by providing a method which works economically. These and other objects have been surprisingly achieved by pulling a single crystal growing on a phase boundary of a melt, wherein heat is delivered to a central portion of the phase boundary, and the radial profile V/G from the center to an edge of the phase boundary is controlled such that the effect of thermomechanical stress fields in the crystal adjoining the phase boundary is compensated for with respect to creation of intrinsic point defects.

BRIEF DESCRIPTION OF THE DRAWINGS

FIG. 2 illustrates the relationship of V/G and the magnitude of thermomechanical stress.

FIG. 3 illustrates the relationship between V/G in the region of compressive stress and in the region of tensile stress and the importance of maintaining the radial profile of V/G such that $(V/G)_t/(V/G)_c$ is greater than 1.5.

FIG. 4 illustrates the differences between one embodiment of a subject invention wafer and prior art wafers with respect to attitude angle.

FIG. 5 illustrates a preferred axial temperature profile in accordance with one embodiment of the present invention.

FIGS. 6a and 6b respectively illustrate the relationship between the radial profile of the temperature gradient G an the magnitude of the thermomechanical stress fields for a (6a) homogenous radial profile V/G, and in inhomogeneous radial profile (6b) in accordance with one embodiment of the present invention.

DETAILED DESCRIPTION OF THE PREFERRED EMBODIMENTS

Figure 1:
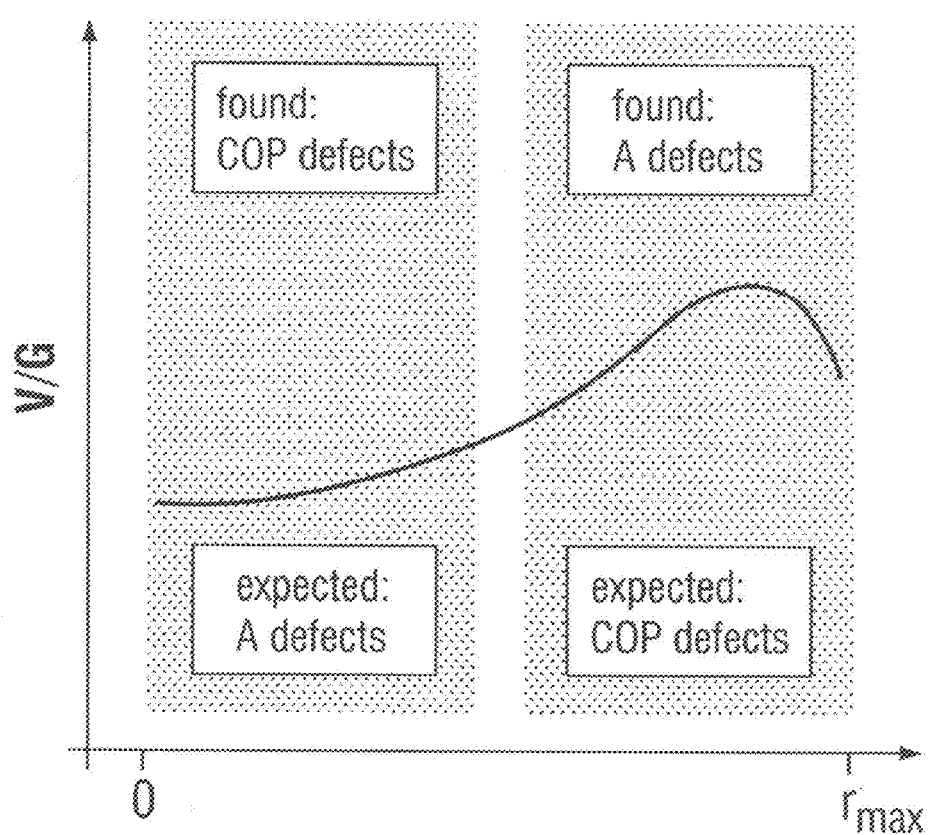
FIG. 1 illustrates defect inconsistencies occurring in actual growth of large single crystal silicon in contradiction to predicted defect patterns with adjustment of V/G ratio radial profile to near the critical ratio.

The invention thus relates to a method for producing semiconductor wafers of silicon, comprising pulling a single crystal growing on a phase boundary from a melt contained in a crucible and cutting of semiconductor wafers from the pulled single crystal, wherein heat is delivered to a center of the phase boundary during pulling, and a radial profile of a ratio V/G from the center to an edge of the phase boundary is controlled, with G being the temperature gradient perpendicular to the phase boundary and with V being the pull rate at which the single crystal is pulled from the melt, wherein the radial profile of the ratio V/G is controlled so that the effect of thermomechanical stress fields in the single crystal adjoining the phase boundary is compensated for with respect to the creation of intrinsic point defects.

After intensive studies, the inventors have identified thermomechanical stress fields as a possible cause by which experimental observations may be explained plausibly. Thermomechanical stress fields can influence the concentration of intrinsic point defects, and therefore indirectly also defect formation, in a surprisingly strong way. According to the inventors' discoveries, the strength of the thermomechanical stress fields must be reduced and their effect must be compensated for in the configuration of the radial profile of V/G, so that in particular single crystals with a diameter of at least 300 mm, from which defect-free semiconductor wafers can be produced, can be pulled economically.

K. Tanahashi and N. Inoue, Journal of Materials Science: Materials in Electronics 10 (1999) 359-363, have addressed thermomechanical stress fields in crystallizing silicon and their effect on the diffusivity and solubility of intrinsic point defects. Although they come to the conclusion that the formation of silicon interstitials is thermodynamically promoted in the region of tensile stress and the formation of vacancies in the region of compressive stress, their model calculations also show that this should not exert any special effects on defect formation.

However, the inventors have surprisingly discovered that the effect of the thermomechanical stress fields can be considerable, and that the magnitude of the stress fields must be limited. Furthermore, their effect must be compensated for with respect to the creation of intrinsic point defects. This is expediently done by keeping the temperature gradient G, in a region of the single crystal which is under compressive stress and adjoins a central zone of the phase boundary, greater than in a region which is under tensile stress, adjoins an edge region of the single crystal and extends as far as the phase boundary. The greater temperature gradient in the region of the compressive stresses makes a larger number of silicon interstitials available, which eliminate the vacancies also present owing to the compressive stresses. The smaller temperature gradient in the region of the tensile stresses makes a larger number of vacancies available, which eliminate the silicon interstitials also present owing to the compressive stresses. A balanced ratio of vacancies and silicon interstitials is obtained as a result, which is desirable because it is a crucial prerequisite for the production of defect-free semiconductor wafers.

With respect to the ratio V/G, a maximally homogeneous radial profile of V/G is not desirable, but instead an inhomogeneous radial profile with a V/G at the phase boundary in the region of the compressive stresses which is less than the critical ratio, and with a V/G at the phase boundary in the region of the tensile stresses which is greater than the critical ratio is desired. The critical ratio is the ratio V/G which is a prerequisite in the case of a flat phase boundary according to the Voronkov model, so that a defect-forming excess of point defects is not created.

FIG. 2 shows that the ratio V/G in the regions of the thermomechanical stress fields must differ ever more strongly from the critical ratio as the strength of the thermomechanical stress fields increases. The compressive and tensile stresses to be expected can be predicted by simulation calculations. Commercially available programs may be used for the calculation, for example the Flow Module program from Semiconductor Technology Research, Inc.

FIG. 3 shows in particular that it is the ratio between V/G in the region of the compressive stresses and V/G in the region of the tensile stresses which is important. The radial profile of V/G is preferably controlled so that (V/G)t/(V/G)c is at least greater than 1.5, preferably greater than 1.8 and more preferably greater than 2, where (V/G)c is the lowest ratio V/G in the region which is under compressive stress and (V/G)t is the highest ratio V/G in the region which is under tensile stress. A strategy based exclusively on the Voronkov model, such as the one formulated for example in DE 103 39 792 A1, attempts to provide a radial profile of V/G which is homogeneous and which differs as little as possible from the critical ratio. A strategy which furthermore takes into account the radial diffusivity of silicon interstitials and is formulated, for example, in U.S. Pat. No. 6,869,478 B2, discloses a radial profile of V/G in which the ratio (V/G)t/(V/G)c always lies significantly below 1.5 and may therefore be referred to as virtually homogeneous. Although semiconductor wafers of silicon which are regarded as defect-free in modern terms can be produced with the latter strategies, this can only be done by methods which must be regarded as economically unviable. The present invention overcomes this shortcoming since the inventive method makes it possible to obtain defect-free semiconductor wafers of silicon from single crystals having a diameter of at least 300 mm, and which are pulled economically at rates of at least 0.5 mm/min.

Such semiconductor wafers, which are also suitable as substrates for producing epitaxial semiconductor wafers and SOI wafers, can also be readily distinguished from defect-free semiconductor wafers of silicon which come from single crystals pulled in the known way, and specifically by the radial profile of the attitude angle $\theta$ of oxygen and dopant striations. The Voronkov model predicts that single crystals for defect-free semiconductor wafers can be pulled rapidly only if the temperature gradient G is increased. Only in this way can the pull rate V be increased and the critical ratio V/G maintained at the same time. The increased heat supply means that the phase boundary assumes the shape of a surface curved convexly toward the single crystal. The extent of the curvature can be specified by a height h. This is the same as the distance between the surface of the melt and the center of the phase boundary. In the case of single crystals which are pulled according to the invention, the curvature of the phase boundary is considerable. The phase boundary may also be regarded as an isothermal surface, i.e. as a surface which is formed by points at which the same temperature prevails. The concentration at which oxygen and dopants, for example boron, phosphorus, arsenic or antimony, are absorbed into the single crystal is sensitive to the temperature in the region of the phase boundary. Inevitable temperature variations not only lead to the axial position of the phase boundary varying by small amounts over the course of time, but also to a take-up of oxygen and dopants into the single crystal which varies as a function of time. The different concentrations of these elements can be revealed in the form of growth striations, which are formed according to the profile of the phase boundary. In a plan view of the semiconductor wafer, the growth striations appear as rings, and as curved lines in side view of a cross section through the semiconductor wafer or through a longitudinal section through a piece of the single crystal. The profile of the attitude angle $\theta$ of these lines provides information regarding the curvature of the phase boundary when pulling the single crystal. Since single crystals with such a profile of attitude angle can only be produced by the method according to the invention, in so far as they deliver defect-free semiconductor wafers of silicon, the profile of the attitude angle $\theta$ is an unequivocal indicator for the application of the method according to the invention.

The invention therefore also relates to a semiconductor wafer of silicon which has neither OSF defects, nor A-swirl defects, nor COP defects with a size of more than 30 nm, with a radial profile of growth striations of oxygen or dopants in which an attitude angle $\theta$ between a horizontal line and the tangent applied to the growth striations lies within a range, expressed in degrees, described by the inequality $\theta < -17 \times (r/rmax)$ when the attitude angle $\theta$ is determined in a range of from $r/rmax=0.1$ to $r/rmax=0.9$, where r is the radial position at which the tangent is applied to the growth striations and rmax denotes the radius of the semiconductor wafer. A semiconductor wafer is therefore a semiconductor wafer according to the invention whenever there is at least one attitude angle $\theta$ in the range of from $r/rmax=0.1$ to $r/rmax=0.9$, the value of which falls within the value range specified by the inequality.

It is preferable for the attitude angle $\theta$ in the range of from $r/rmax=0.1$ to $r/rmax=0.9$ to remain entirely in the aforementioned value range. According to a preferred embodiment, a semiconductor wafer is therefore a semiconductor wafer according to the invention if every attitude angle $\theta$ in the range of from $r/rmax=0.1$ to $r/rmax=0.9$ lies in the range specified by the inequality.

It is particularly preferable for the attitude angle $\theta$ in the range of from $r/rmax=0.1$ to $r/rmax=0.9$ to remain entirely in a range which is described by the modified inequality $-50 \times (r/rmax) < \theta < -17 \times (r/rmax)$. According to the particularly preferred definition, a semiconductor wafer is therefore a semiconductor wafer according to the invention if every attitude angle θ in the range of from r/rmax=0.1 to r/rmax=0.9 lies in the range specified by the modified inequality.

FIG. 4 graphically represents the way in which semiconductor wafers according to the invention can differ from those of the prior art. If the attitude angle θ is plotted against the radius of the semiconductor wafer, then it is only for semiconductor wafers according to the invention that the resulting line lies in a zone that is described by the specified inequality. The zone is restricted to radial positions r/rmax of from 0.1 to 0.9, because the attitude angle θ in the adjoining regions can not be determined accurately. For comparison, FIG. 4 also indicates the profile of the attitude angle θ obtained for semiconductor wafers which are produced according to the methods described in U.S. Pat. No. 6,869,478 B2 and DE 103 39 792 A1, respectively.

Besides oxygen and at least one dopant, the semiconductor wafers according to the invention preferably also contain at least one of the elements carbon, nitrogen and hydrogen. If nitrogen is present, then the concentration is preferably from $2.0 \times 10^{13}$ to $1.0 \times 10^{15}$ atoms/cm$^3$. The presence of carbon, nitrogen or both elements assists the formation of BMDs and therefore improves getterability. It is thus particularly advantageous for the oxygen concentration to be comparatively low when these dopants are present. The presence of hydrogen hinders the formation of OSF defects, and thus makes it particularly advantageous for the oxygen concentration to be comparatively high.

For controlling the radial profile of the ratio V/G according to the invention, in principle any measure may be envisaged which is known to have an effect on one of these parameters. Since there is little latitude for varying the pull rate owing to the criterion of having to be able to pull as economically as possible and therefore as rapidly as possible, most of these measures are aimed at adjusting the radial profile of the temperature gradient G, particularly in the regions of the compressive and tensile stresses, according to the specifications of the invention. This is best achieved by suitably configuring and influencing the close vicinity of the single crystal, the so-called hot zone, and, accordingly, also by suitable measures for supplying heat to the single crystal and dissipating heat from the single crystal. Measures which have been described in DE 103 39 792 A1 and U.S. published application US 2006/292890, both incorporated herein by reference for controlling the ratio V/G, for example, are particularly preferred. An example particularly to be mentioned is the use of a heat source, by which heat can be transported in a particular degree to the center of the phase boundary, and particularly in the configuration of a heater which is arranged below the crucible center and can be raised and lowered with the crucible. Such a heater is particularly preferred when it generates a radial temperature profile at the crucible bottom, with a pronounced temperature maximum at the center of the crucible bottom. In addition, the crucible bottom may be heated with the aid of a heat source which is arranged statically under the crucible and is therefore not raised together with the crucible when pulling the single crystal.

Together with a conventional side heater, which encloses the crucible, heat is thus preferably delivered to the melt in three ways. The desired heat transport directed toward the center of the phase boundary may also be brought about by rotating the crucible and the single crystal in the same sense, even though the increase of G thereby achieved is less pronounced. By the additional use of magnetic fields, in particular horizontal fields or CUSP fields or traveling magnetic fields, not only can the concentration of oxygen in the single crystal be limited, but also an effect can be exerted on the heat transport. Thus, CUSP fields in particular are suitable as means for focusing a melt flow which is directed upward toward the center of the phase boundary and transports heat. This effect is particularly pronounced when the neutral plane of the CUSP field, where the CUSP field equates to an axisymmetric horizontal field, lies at a distance above the surface of the melt which is equal to at least 50 mm. A further instrument for increasing the temperature gradient G is a cooler, which surrounds the single crystal and effectively dissipates heat from the single crystal. Likewise suitable for controlling the temperature gradient G, but also for reducing thermomechanical stresses in the single crystal, is a heat source which heats an edge of the single crystal adjoining the phase boundary, most preferably in the configuration of an annular heater surrounding the single crystal near the surface of the melt.

The annular heater and the cooler are preferably operated in such a way that the axial temperature profile on the surface of the single crystal can be described by a curve which has at least one point of inflexion, i.e. can be approximated by a polynomial of at least third order, and which therefore differs from the parabolic temperature profile described in U.S. Pat. No. 6,869,478 B2. The preferred axial temperature profile is represented in FIG. 5. The single crystal is preferably not cooled until a distance above the surface of the melt which is greater than the height h between the center of the phase boundary and the surface of the melt.

FIGS. 6a and 6b show a comparison of the radial profile of the temperature gradient G and the strength of the thermomechanical stress fields, when, for the rapid pulling of large single crystals, on the one hand the strategy is adopted of keeping the radial profile of V/G as homogeneous as possible and close to the critical ratio (FIG. 6a), and on the other hand proceeding according to the invention (FIG. 6b). If the radial profile of V/G is configured homogeneously, then a region is formed in the single crystal with strongly pronounced compressive stresses, which adjoins a central zone of the phase boundary, and a region with strongly pronounced tensile stresses which adjoins an edge region of the single crystal and the phase boundary. The consequence of this is that the ratio V/G adjusted to the critical ratio differs significantly in both regions from the value which would be necessary in order to avoid a defect-forming excess of intrinsic point defects. In contrast to this, the different spacing of the isothermal lines in FIG. 6b shows that such a detrimental adjustment of the ratio V/G does not take place with the method according to the invention. A high temperature gradient G is adjusted in the region of the compressive stresses and a lower temperature gradient G in the region of the tensile stresses, as a result preventing a defect-forming excess of intrinsic point defects from being created. FIG. 6b furthermore shows that the strength of the stress fields is reduced by using the annular heater, and it is therefore easier to counteract their effect on the defect formation by adapting the radial profile of V/G according to the invention. The height h is preferably at least 20 mm.

The oxygen concentration in the single crystal is also preferably controlled, so that no OSF defects are formed even if the single crystal is pulled under conditions which promote the formation of such defects. On the other hand, there should preferably be sufficient oxygen so that enough nucleation centers are present for oxygen precipitates (BMDs). A concentration according to ASTM Standard F121-83 in the range of from $5 \times 10^{17}$ atoms/cm$^3$ to $6.5 \times 10^{17}$ atoms/cm$^3$ is preferably adjusted. The oxygen concentration is preferably controlled via the field strength generated by the magnet coils, via the pressure in the pulling system and via the flow rate per unit time with which an inert gas, for example argon, is fed through the pulling system, or by a combination of these control instruments. The oxygen content in the single crystal is dependent on the melt flows. With rotation of the single crystal and the crucible in the same sense, for example, increased crucible rotation leads to a higher oxygen content. Field strengths of at least 10 mT (7960 A/m) to 80 mT (63700 A/m) in the melt are particularly preferred in the region of the pulling axis, as well as a pressure-flow rate ratio of from 0.004 to 0.03 mbar/(l/h).

Comparative Example

An attempt was made to pull a single crystal of silicon at a rate of 0.64 mm/min, with the aim of obtaining as many defect-free semiconductor wafers as possible. In order to achieve this aim, the radial profile of the ratio V/G was controlled according to the strategy formulated in DE 103 39 792 A1, i.e. to obtain a maximally homogeneous radial profile lying at the critical ratio. The maximum difference from the critical ratio was actually no more than 9%. With this strategy, however, no defect-free semiconductor wafers could be obtained.

Example

In order to produce semiconductor wafers according to the invention, the same device was used as in the comparative example.

Figure 7:
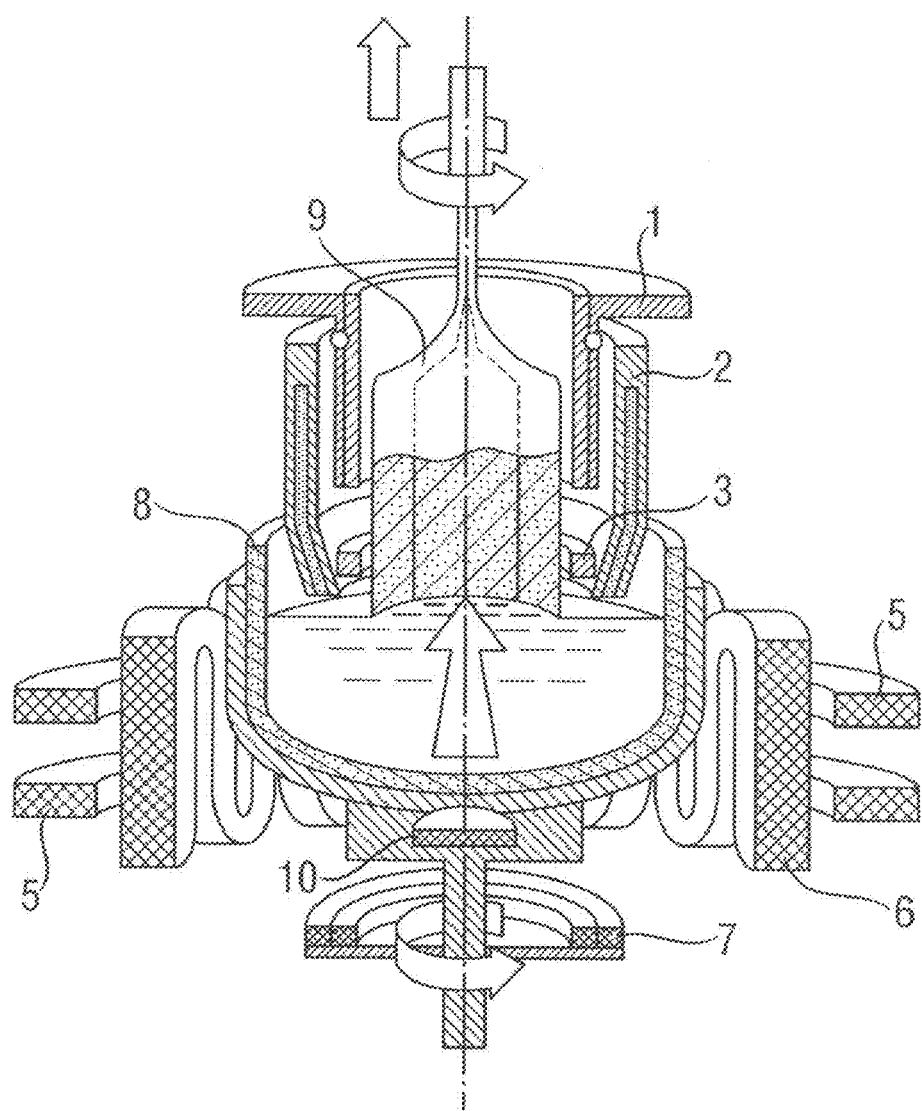
FIG. 7 illustrates one crystal growth device suitable for use in the method of the present invention.

The device represented in FIG. 7 comprised, a crucible 8 containing the melt and a side heater 6 surrounding the crucible, as well as a heat shield 2. The device furthermore contained two mutually opposite magnetic field coils 5 which generated a CUSP magnetic field, and a bottom heater 10 raisable with the crucible for transporting heat to the center of the phase boundary of the growing single crystal 9. Other features of the pulling device were a stationary bottom heater 7, a cooler 1 surrounding the single crystal and cooled with water and blackened on the inner surface, as well as an annular heater 3.

Figure 8:
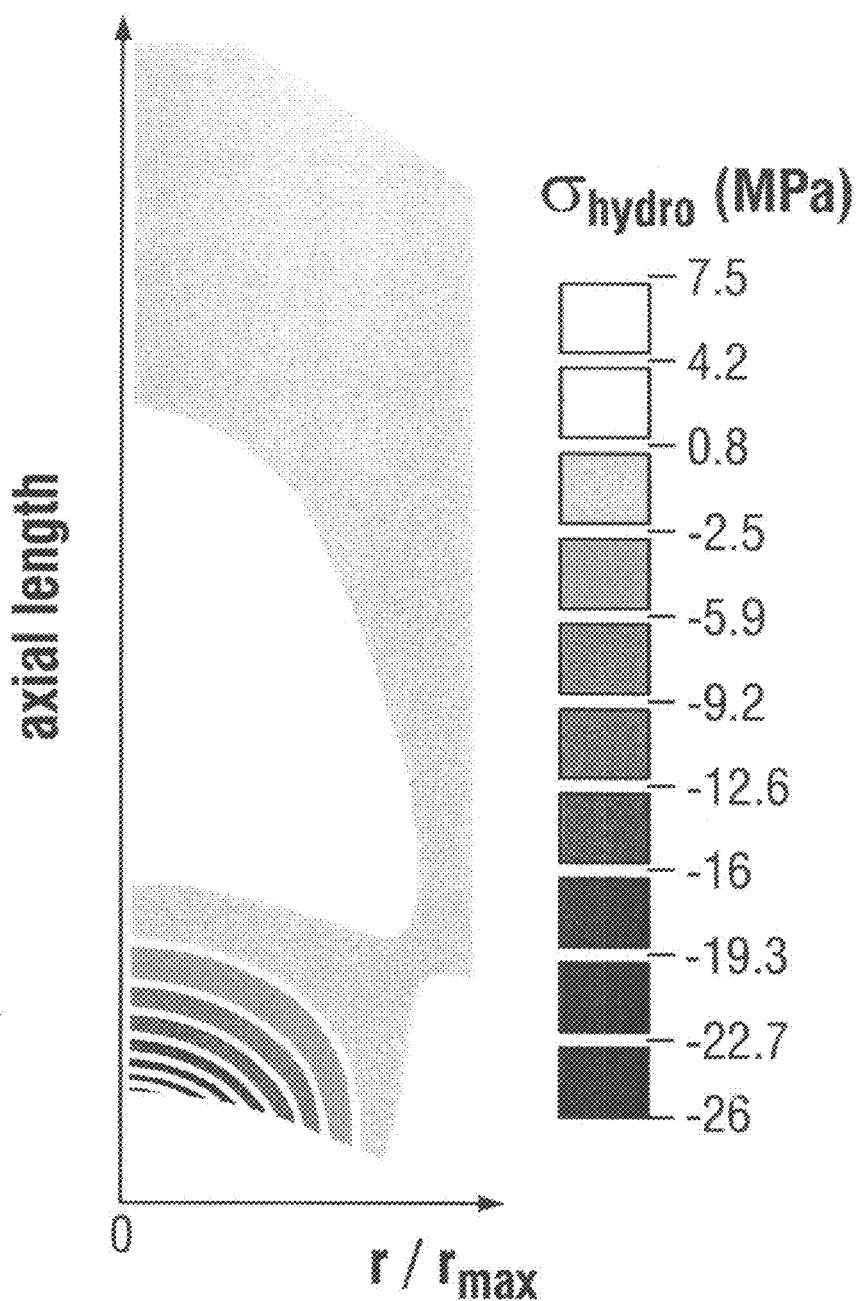
FIG. 8 illustrates thermomechanical stress zones in the hot zone of a growing crystal.

A map, which reveals thermomechanical stress fields in the single crystal, was compiled for this hot zone with the aid of simulation calculations. The aforementioned Flow Module program, which two-dimensionally calculates the elastic stresses axisymmetrically and isotropically, was used as the simulation program. The calculations were based on a Young's modulus of silicon, E=150 GPa, the Poisson ratio v=0.25 and the linear expansion coefficient $\alpha=2.6\times10^{-6}$/K. As shown by FIG. 8, thermomechanical stresses of up to –26 MPa were found in the region of the compressive stresses, and up to 7.53 MPa in the region of the tensile stresses. In order to take account of this observation, the radial profile of V/G was modified and adjusted according to the representation in FIG. 3, with a ratio (V/G)t/(V/G)c of approximately 1.93 and (V/G)c/(V/G)crit of 0.7 and (V/G)t/(V/G)crit of 1.35 and with (V/G)crit being the critical ratio.

From the single crystal pulled under these conditions at a rate of 0.6 mm/min, defect-free semiconductor wafers of silicon with a diameter of 300 mm could be obtained with high yield. Neither A-swirl defects nor FPD nor OSF defects could be detected on the silicon wafers. The examination for COP defects was carried out with a scattered laser light meter of the MO-4 type from Mitsui, Mining, the application of which is described for example by Nakai et al. in Jap. Journal of Applied Physics, Vol. 43, No. 4A, 2004, pp. 1247-1253. No COP defects with a diameter of more than 30 nm were found.

Figure 9A:
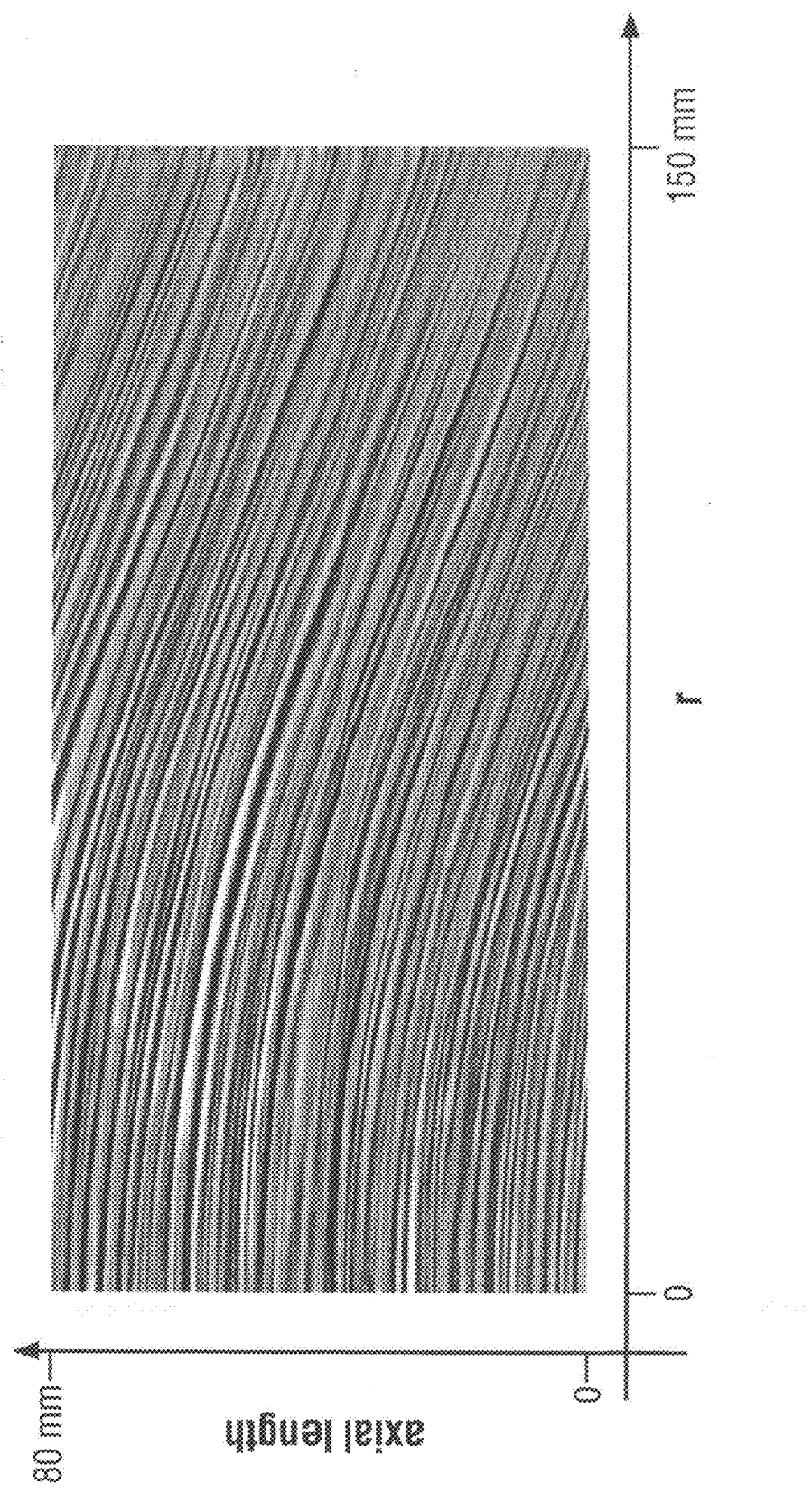
FIGS. 9a and 9b illustrate the attitude angle $\theta$ as revealed by photoscan of a longitudinal section of a pulled single crystal and a wafer, respectively.
Figure 9B:
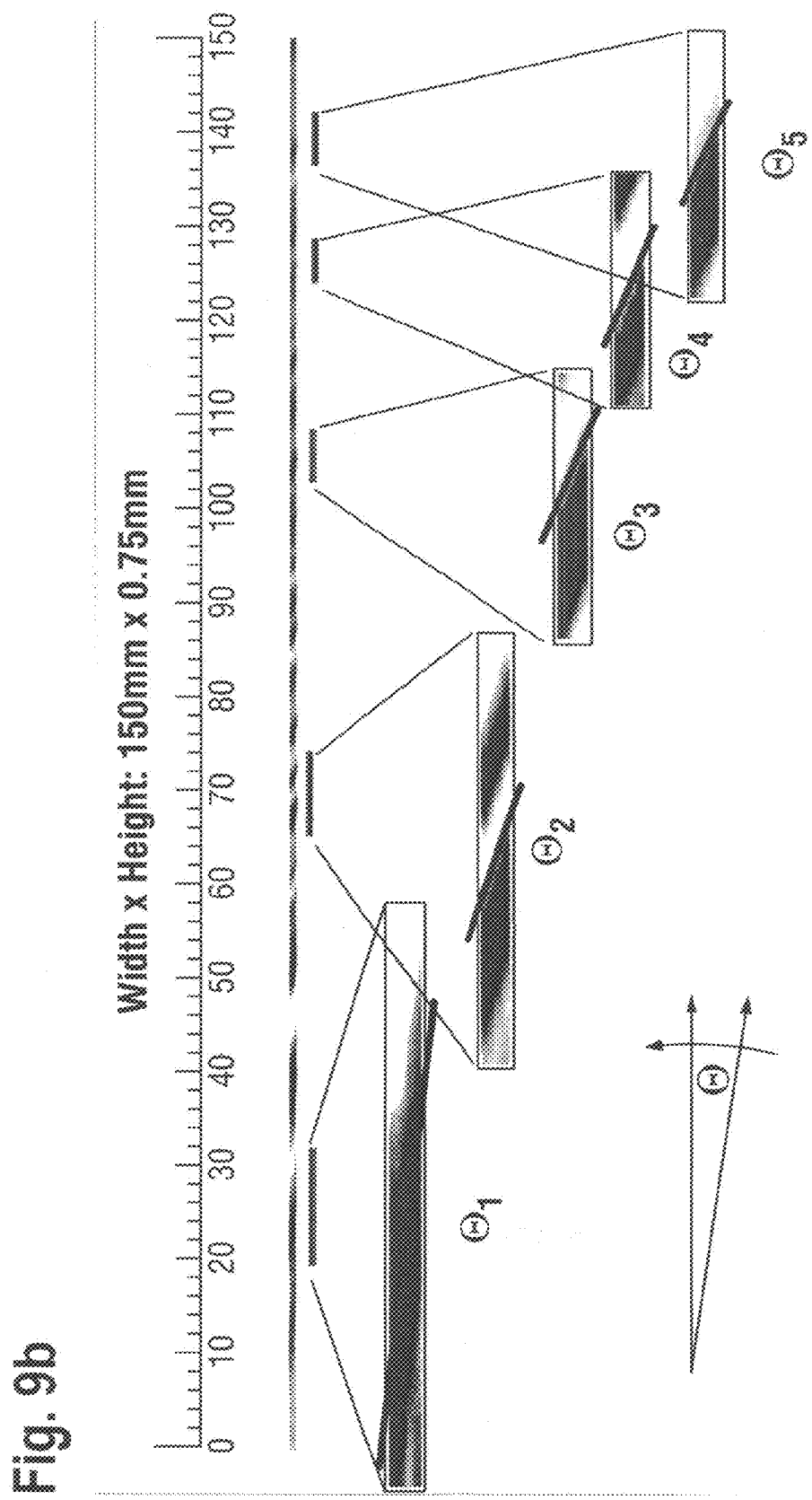

FIGS. 9a and 9b show the result of a photoscan, by which the profile of the dopant striations was revealed. In this method, charge carriers are stimulated by laser light and detected electrically. FIG. 9a shows the side view of a panel-shaped longitudinal section through an 80 mm long piece of the pulled single crystal. FIG. 9b represents the way in which the radial profile of the attitude angle θ is established by evaluating the side view of a cross section through the semiconductor wafer. The radial profile established for the attitude angle θ in the example corresponded to the profile represented in FIG. 4.

As an alternative or in addition to the evaluation of dopant striations, the radial profile of the attitude angle θ may also be established by a similar evaluation of oxygen striations. The oxygen striations are revealed by etching the fracture edge after the precipitation of oxygen by a heat treatment, and assessing it by oblique exposure to UV light.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor wafer of silicon which has neither OSF defects, nor A-swirl defects, nor COP defects with a size of more than 30 nm, with a radial profile of growth striations of oxygen or dopants in which an attitude angle θ between a horizontal line and the tangent applied to the growth striations lies in a range, expressed in degrees, described by the inequality θ<–17×(r/rmax) when the attitude angle θ is determined in a range of from r/rmax=0.1 to r/rmax=0.9, where r is the radial position at which the tangent is applied to the growth striations and rmax denotes the radius of the semiconductor wafer.

2. The semiconductor wafer of claim 1, wherein the attitude angle θ in the range of from r/rmax=0.1 to r/rmax=0.9 lies without exception in the range of θ<–17×(r/rmax).

3. The semiconductor wafer of claim 1, wherein the attitude angle θ in the range of from r/rmax=0.1 to r/rmax=0.9 lies without exception in a subrange described by the inequality –50×(r/rmax)<θ<–17×(r/rmax).

4. The semiconductor wafer of claim 1, further comprising at least one element selected from the group consisting of carbon, nitrogen and hydrogen.

5. The semiconductor wafer of claim 4, having a nitrogen concentration of from $2.0\times10^{13}$ to $1.0\times10^{15}$ atoms/cm$^3$.

6. The semiconductor wafer of claim 1, having an oxygen concentration of from $5\times10^{17}$ atoms/cm$^3$ to $6.5\times10^{17}$ atoms/cm$^3$.

* * * * *